US010950962B2

(12) United States Patent
Schmidbauer et al.

(10) Patent No.: US 10,950,962 B2
(45) Date of Patent: Mar. 16, 2021

(54) ELECTRICAL CONNECTOR AND ELECTRICAL CABLE ARRANGEMENT CONNECTED THERETO

(71) Applicant: LISA DRAEXLMAIER GMBH, Vilsbiburg (DE)

(72) Inventors: Fabian Schmidbauer, Taufkirchen/Vils (DE); Daniel Wiesmayer, Vilsbiburg (DE); Florian Komar, Velden (DE)

(73) Assignee: LISA DRAEXLMAIER GMBH, Vilsbiburg (DE)

( * ) Notice: Subject to any disclaimer, the term of this patent is extended or adjusted under 35 U.S.C. 154(b) by 0 days.

(21) Appl. No.: 16/880,124

(22) Filed: May 21, 2020

(65) Prior Publication Data
US 2020/0287309 A1 Sep. 10, 2020

Related U.S. Application Data

(63) Continuation of application No. PCT/EP2018/077312, filed on Oct. 8, 2018.

(30) Foreign Application Priority Data

Nov. 21, 2017 (DE) ..................... 10 2017 127 382.4

(51) Int. Cl.
H01R 12/73 (2011.01)
H01R 11/11 (2006.01)
(Continued)

(52) U.S. Cl.
CPC ........... H01R 12/732 (2013.01); H01R 11/11 (2013.01); H01R 12/53 (2013.01); H01R 12/714 (2013.01);
(Continued)

(58) Field of Classification Search
CPC ...... H01R 12/732; H01R 11/11; H01R 12/53; H01R 12/714; H01R 13/6271;
(Continued)

(56) References Cited

U.S. PATENT DOCUMENTS 3,737,833 A 6/1973 Jerominek
8,241,049 B2 8/2012 Sun
(Continued)

FOREIGN PATENT DOCUMENTS

DE 1242284 6/1967
DE 102011110441 2/2013
(Continued)

OTHER PUBLICATIONS

International Search Report for International Application PCT/EP2018/077312, dated Nov. 22, 2018.

Primary Examiner — Abdullah A Riyami
Assistant Examiner — Justin M Kratt
(74) Attorney, Agent, or Firm — Burris Law, PLLC

(57) ABSTRACT

An electrical connector for electrically connecting at least two electrical conductors featuring first and second electrical cables. The connector features at least one first conductor plate allocated to the first cable and at least one second conductor plate allocated to the second cable. Each conductor plate features in total a number of conducting structures with first contact sections which corresponds to at least the number of the conductors for electrical contacting of the allocated conductors and also second contact sections. Furthermore, the connector features a number of coupling elements corresponding to the number of conductors which are designed for electrically contacting the second contact sections of the respective conductor plate allocated to the respective conductor by bridging of a spatial gap between the first and second conductor plate.

9 Claims, 2 Drawing Sheets

(51) Int. Cl.
  *H01R 12/53* (2011.01)
  *H01R 12/71* (2011.01)
  *H01R 13/187* (2006.01)
  *H01R 13/627* (2006.01)
  *H01R 31/06* (2006.01)
  *H05K 1/11* (2006.01)
  *H01R 11/00* (2006.01)
  *H01R 12/75* (2011.01)
  *H01R 12/72* (2011.01)
  *H01R 12/70* (2011.01)
  *H01R 12/00* (2006.01)

(52) U.S. Cl.
  CPC ....... *H01R 13/187* (2013.01); *H01R 13/6271* (2013.01); *H01R 11/00* (2013.01); *H01R 12/00* (2013.01); *H01R 12/70* (2013.01); *H01R 12/71* (2013.01); *H01R 12/72* (2013.01); *H01R 12/73* (2013.01); *H01R 12/75* (2013.01); *H01R 13/627* (2013.01); *H01R 31/06* (2013.01); *H01R 2201/26* (2013.01); *H05K 1/11* (2013.01); *H05K 2201/10189* (2013.01)

(58) Field of Classification Search
  CPC .... H01R 2201/26; H01R 31/06; H01R 12/73; H01R 12/75; H01R 11/00; H01R 12/00; H01R 12/70; H01R 12/71; H01R 12/72; H01R 13/627; H05K 2201/10189; H05K 1/11
  USPC .............. 439/626, 284, 291, 290, 295, 631
  See application file for complete search history.

(56) References Cited

U.S. PATENT DOCUMENTS

| | | |
|---|---|---|
| 2008/0293262 A1 | 11/2008 | Duesterhoeft et al. |
| 2011/0111628 A1* | 5/2011 | Su ..................... H01R 13/6594 439/607.01 |
| 2012/0190219 A1* | 7/2012 | Pai ....................... H01R 12/732 439/65 |
| 2015/0155670 A1 | 6/2015 | Gardner |
| 2016/0181716 A1* | 6/2016 | Ramanna ............... H01R 13/28 439/345 |
| 2016/0380387 A1* | 12/2016 | Wu .................... H01R 13/6658 439/95 |
| 2017/0110837 A1* | 4/2017 | Taniguchi ......... H01R 13/6683 |
| 2018/0205181 A1* | 7/2018 | Chen ................. H01R 13/627 |

FOREIGN PATENT DOCUMENTS

| | | |
|---|---|---|
| DE | 102012213391 | 5/2014 |
| EP | 0119013 | 9/1984 |
| JP | H07176341 | 7/1995 |
| WO | 2012023505 | 2/2012 |

* cited by examiner

ELECTRICAL CONNECTOR AND ELECTRICAL CABLE ARRANGEMENT CONNECTED THERETO

CROSS-REFERENCE TO RELATED APPLICATIONS

This application is a continuation of International Application No. PCT/EP2018/077312, filed on Oct. 8, 2018, which claims priority to and the benefit of DE 10 2017 127 382.4, filed on Nov. 21, 2017. The disclosures of the above applications are incorporated herein by reference.

FIELD

The present disclosure relates to an electrical connector for electrical connecting of a first and a second electrical cable, each of which features at least two electrical conductors. Furthermore, the present disclosure relates to an electrical cable arrangement in which two cables are connected to each other with one such connector.

BACKGROUND

The statements in this section merely provide background information related to the present disclosure and may not constitute prior art.

For data cables and similar applications in motor vehicles, twisted cable pairs are frequently used, in general to improve the electromagnetic compatibility (EMC), that is, for example, to improve the crosstalk behavior of the data cable. Cables of this kind, in particular unshielded twisted pairs (UTP), are installed in vehicles, inter alia for ethernet applications and for differential bus systems, such as the CAN bus or FlexRay, for instance. To obtain the best possible electrical transmission properties of the cable, it is twisted along the greatest possible length (twisted length) and only at the end of the cable is there a comparatively short length of a few centimeters where the cables are untwisted, that is, not twisted (untwisted length). The electrical transmission properties of the data cable are improved, in particular with regard to differential signals in the vehicle, with a greater twisted length and/or a shorter untwisted length, respectively.

However, if twisted cables are equipped with plug connector housings or similar features, then frequently the issue arises that with very short untwisted lengths, the proper orientation of the contact parts to the orientation of the housing chambers is not assured, so that the cable ends equipped with electrical contact parts can hardly be introduced into the plug connector housing, if at all. The insertion of the contact parts into the plug connector housing in this case would only be possible if the cable ends are again partially untwisted.

In this regard it is known from DE 10 2012 213 391 A1 that in particular with regard to automotive ethernet applications, an excessive untwisted length means that the system-relevant electrical properties of the transmission medium cannot be maintained.

To alleviate this issue, the referenced prior art proposes that an electrical plug contact be provided in the transition region between a twisted and an untwisted portion of a cable and an electrical plug contact disposed at the cable ends. The plug contacts are attached to a rotating and displaceable rotary tool which is then rotated and displaced in order then to twist the as yet untwisted part of the cable. Next, the cable ends and/or the plug contacts are gripped by a gripping element such that the cable ends and/or the plug contacts remain unchanged in their proper alignment even after removal of the rotary tool. Even though in this case a correct alignment of the cable ends and/or plug contacts is attained, the manufacture of this kind of cable is made more complicated due to the tools required and the gripper. In addition, the integration of the proposed tool into existing automatic placement machines is relatively complicated.

In addition, a plug connector is known from U.S. Patent Publication No. 2015/0155670, for example, in which the cable ends of cables are first inserted with a short untwisted length into a first housing, and this is then inserted into the actual plug connector housing. The disadvantage here is that for automated assembly of this configuration, the cable ends have to be inserted repeatedly into housings.

SUMMARY

This section provides a general summary of the disclosure and is not a comprehensive disclosure of its full scope or all of its features.

The present disclosure uses a relatively simple assembly means and creates a method for electrical connecting and/or coupling of at least two electrical cables which can be automated with very little effort.

According to the present disclosure, an electrical connector for electrical coupling of at least two, and in one form mutually twisted, electric conductors featuring first and second electrical cables is provided. The conductors can also feature a separate insulating sheath which is removed at the free end for electrical coupling.

The connector features at least one first conductor plate allocated to the first cable, and also at least one second conductor plate allocated to the second cable. The conductor plate allocated to the respective cable can be understood herein to mean that the first conductor plate is electrically connected (only) to the conductors of the first cable, and the second conductor plate is electrically connected (only) to the conductors of the second cable. Each of the two conductor plates features a number of conducting structures, such as circuit paths, corresponding in total to at least the number of conductors, with first contact sections for electrical contacting of the allocated conductors and also second contact sections. The first contact sections can be arranged advantageously for firmly bonded joining, e.g. by soldering to the conductors. Furthermore, the connector features a number of coupling elements corresponding to the number of conductors which are designed for electrical contacting of the second contact sections of the respective conductor plate allocated to the respective conductor by bridging of a spatial gap or distance between the first and second conductor plate. The substrates of the conductor plates can be positioned end to end, however, no electrical connection may come about. The coupling elements can be, for example, punched/bent parts made of an electrically conducting metal material. Ideally they can be bent such that the contacting of the second contact sections can occur with a spring force.

The configuration of the connector according to the present disclosure offers several advantages. For example, the conductors need not be provided with electrical contact parts which then have to be inserted in the proper position into the contact part housing. Rather, the conductors can be twisted with a particularly short untwisted length, and then can be firmly bonded, in principle independently of their position and alignment, with the first contact sections of the associated conductor plate. Due to the elimination of the alignment of contact parts, the manufacture of an electrical cable arrangement due to the invented connector can be more easily automated and/or tools are no longer used for aligning and checking the alignment of the contact parts. This simplification of the manufacture also improves the process reliability. Moreover, due to the short, untwisted length, the cable arrangement configured with the connector is distinguished by a good electromagnetic compatibility (EMC).

A particularly advantageous form of the present disclosure provides that the coupling elements rest in a detachable manner against the respective second contact sections. Thus only a solder connection is used between the conductors and the first contact sections, whereas the second contact sections are contacted merely due to their mutual abutment.

To protect the coupling elements against mechanical factors, the coupling elements can be arranged within an electrically insulating coupling housing which is attached or can be attached to the two cables. The coupling housing can thus also establish a mechanical connection between the cables to be electrically coupled, and thus hold them together. The connection can be produced advantageously indirectly by means of a cable end housing, for example.

For contacting of the coupling elements, the connector can also be designed as a plug connector, in that the respective conductor plate is inserted or can be inserted, as least in sections, into the coupling housing connecting the cables. Firstly, the conductors are firmly bonded to the respective conductor plate, then at least a portion of the conductor plates are inserted from different sides into the coupling housing, so that the conductor plates are electrically connected.

For simpler handling, in particular simple assembly of the connector, the coupling elements can be embedded in the coupling housing, in particular by over-molding with plastic. In this case the coupling elements can be placed, for example, into an injection molding tool, and then over-molded with a suitable plastic material.

In order firstly to protect the conductors and in particular their contact sections to the conductor plates, and secondly to create a possibility to connect the two cables, at the end of the respective cable an electrically insulating cable end housing can be provided and the conductor plate can protrude, at least in sections, beyond the respective conductor plate. Alternatively the cable end housing can also be designed such that the conductor plate does not protrude, but that the cable end housing features an opening for insertion of the coupling elements.

In order to further improve the EMC the respective cable end housing can feature an electrical shielding element. This can be designed, for example, as a metal insert and can be embedded in the respective cable end housing, for example by over-molding with plastic.

In addition it is also possible that the coupling housing features an electrical shielding element, which may also be a metal insert. Then a transfer of the shielding can occur between the shielding elements of the cable end housing and the coupling housing.

In order also to connect the two cables mechanically to each other, the respective cable end housing can feature a snap-in unit for connecting the two cables by means of a spacer element that snaps into the snap-in unit, in particular by means of the coupling housing. The snap-in unit can be designed as a snap-in tongue which can be snapped in with a doubled opposing snap-in unit of the spacer element, in particular of the coupling housing.

The present disclosure also relates to an electrical cable arrangement which features at least two electrical cables, which each feature at least two electrical conductors. A connector that couples the cables to each other in one or in a plurality of the preceding designs is disposed between the cables.

In one particularly advantageous form, a cable end housing with a snap-in unit facing away from the cable end is arranged at the cable end of the respective cable facing the connector. In one form, the cable end housing can be designed identically for both cable ends, so that it then pertains to equivalent parts. The cable end housings can each be affixed to the cable end by means of a positive locking and/or firmly bonded connection, like that known from crimping, for example. Then in order to connect the cable end housings and thus also the cables mechanically to each other, a spacer element, in particular a symmetrically designed spacer element, is snapped into the two cable end housings.

Coupling elements for electrical connecting of two conductor plates are provided for the employed connector. In order that the mechanical connection of the cables does not use an additional spacer element, the cable end housings can be connected together by means of a snap-in coupling housing.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
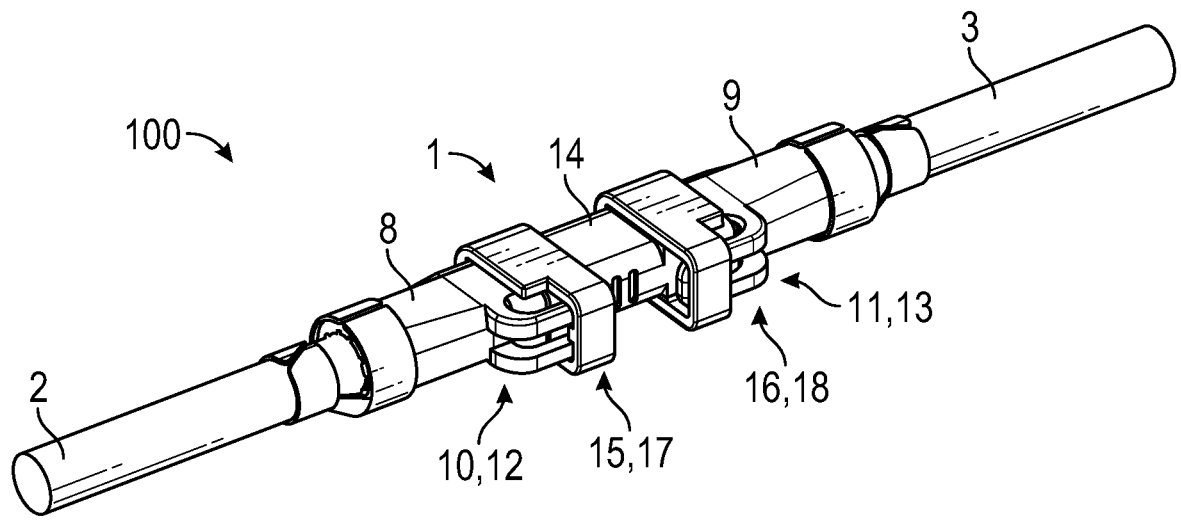
FIG. 1 is a perspective side view of an electrical cable arrangement according to the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 shows a perspective view of an electric cable arrangement 100 which is suitable, for example, for data cables in a motor vehicle. The cable arrangement 100 features an electrical (which is also mechanical) connector 1, which connects together two mutually aligned electrical cables 2 and 3, which in this case pertains to what are known as unshielded twisted pair (UTP) cables. These cables each feature two electric conductors 4 and 5, twisted together, that is, twisted in pairs, of the first cable 2 and/or 6 and 7 of the second cable 3 (see FIG. 2), wherein the number of conductors in this exemplary example is selected merely as an example. The cables 2, 3 each feature an outer insulating sheath (not designated in detail) in which the conductors 4, 5 and/or 6, 7 are arranged twisted together. At their free ends facing the other cable 2, 3 the conductors 4, 5 and/or 6, 7 respectively, are exposed by removal of an inner insulating sheath (not designated in detail).

A cable end housing 8 and 9 is disposed at each of the cable ends of the cables 2, 3 to be aligned to each other, and these pertain to identically designed parts. A positive-locking and firmly bonded detent exists between the cable end housings 8, 9 for the affixing, wherein additionally a tension relief element (not designated in detail) is supplied which connects the respective cable end housing 8, 9 to the outer insulating sheath of the corresponding cable 2, 3. In order to be able to connect the cable end housings 8, 9 together, each cable end housing 8, 9 features a snap-in unit 10, 11, which have essentially a snap-in tongue 12, 13 which extends to the other respective cable 2, 3.

The cable end housings 8, 9 are connected together by means of a symmetrically designed coupling housing 14 that snaps into the snap-in units 10, 11. These coupling housings each feature two opposing snap-in units 15, 16. The opposing snap-in units 15, 16 each have available a snap-in bar 17, 18 on which an inward-directed snap-in lug (not depicted in detail) is formed to engage with the snap-in tongues 12, 13.

Figure 2:
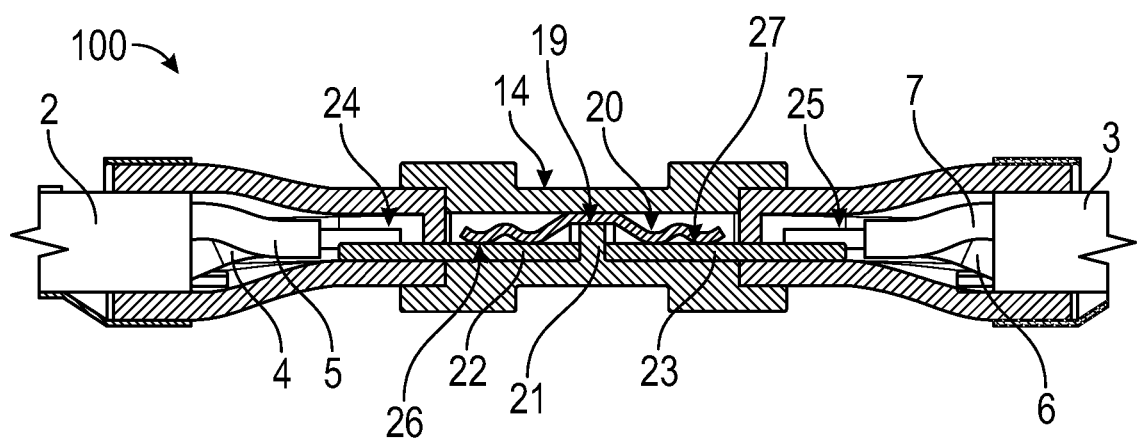
FIG. 2 is a cross-sectional view of the cable arrangement of FIG. 1 according to the present disclosure.

As depicted in FIG. 2, which shows a cross-sectional view of the cable arrangement 100, a plurality of mutually identical coupling elements 19 are arranged in the coupling housing 14 which are designed here as spring elements. The number of coupling elements 19 corresponds to the number of conductors 4 to 7 of the cables 2, 3, which are to be connected mechanically by means of the coupling housing 14, and which are to be connected together by means of the coupling elements 19. Only the first coupling element of several coupling elements 19 arranged side by side is depicted in FIG. 2 based solely on the side, cross-sectional view. The coupling elements 19 are of symmetrical design, in particular in the longitudinal direction of the cable arrangement 100, and at least in this exemplary form are embedded in the coupling housing 14, in that they are over-molded with the plastic material of the coupling housing 14. The coupling housing 14 features a receiving space 20 designed to be continuous in the longitudinal direction of the cable arrangement 100 and this receiving space is open on both sides such that the coupling elements 19 are accommodated therein and are held in position by the plastic material with a molded middle web 21.

Furthermore from FIG. 2 it is evident that the coupling elements 19 on the one hand rest against a first conductor plate 22, and secondly rest against a second conductor plate 23. In turn, the first conductor plate 22 with the conductors 4, 5 of the first cable 2, and the second conductor plate 23 with the conductors 6, 7 of the second cable 3, are electrically connected by means of a firmly bonded connection created by soldering. In this regard the conductor plates 22, 23 each feature a number of associated, first contact sections 24 and/or 25 which each correspond to one of the conductors 4, 5 and/or 6, 7, respectively. The conductor plates 22, 23 are held in the respective cable end housings 8, 9 and protrude outward from there in the direction of the other cable 2, 3. As shown, at least a section of the conductor plates 22, 23 extend beyond the respective cable end housing 8, 9. Second contact sections 26, 27, which are formed on the section of the conductor plates 22, 23 protruding past the cable end housing 8, 9, are electrically connected to the first contact sections 24, 25 by means of guide structures (not illustrated) in the form of conductor paths.

As is evident in FIG. 2, the coupling elements 19 each rest simultaneously against the second contact sections 26 of the first conductor plate 22 and against the second contact sections 27 of the second conductor plate 23 and thus contact them electrically. This means that the second respective contact sections 26, 27 are electrically connected to each other in pairs by means of the coupling elements 19. In this case the conductor plates 22, 23 are inserted from opposite directions into the receiving space 20 of the coupling housing 14 and are in contact there with the correspondingly bent coupling elements 19.

Thus the cables 2, 3 are mechanically connected together by means of the coupling housing 14, and the conductors 4 and 6 as well as 5 and 7 are electrically connected to each other by means of the coupling elements 19 housed in the coupling housing 14.

Figure 3:
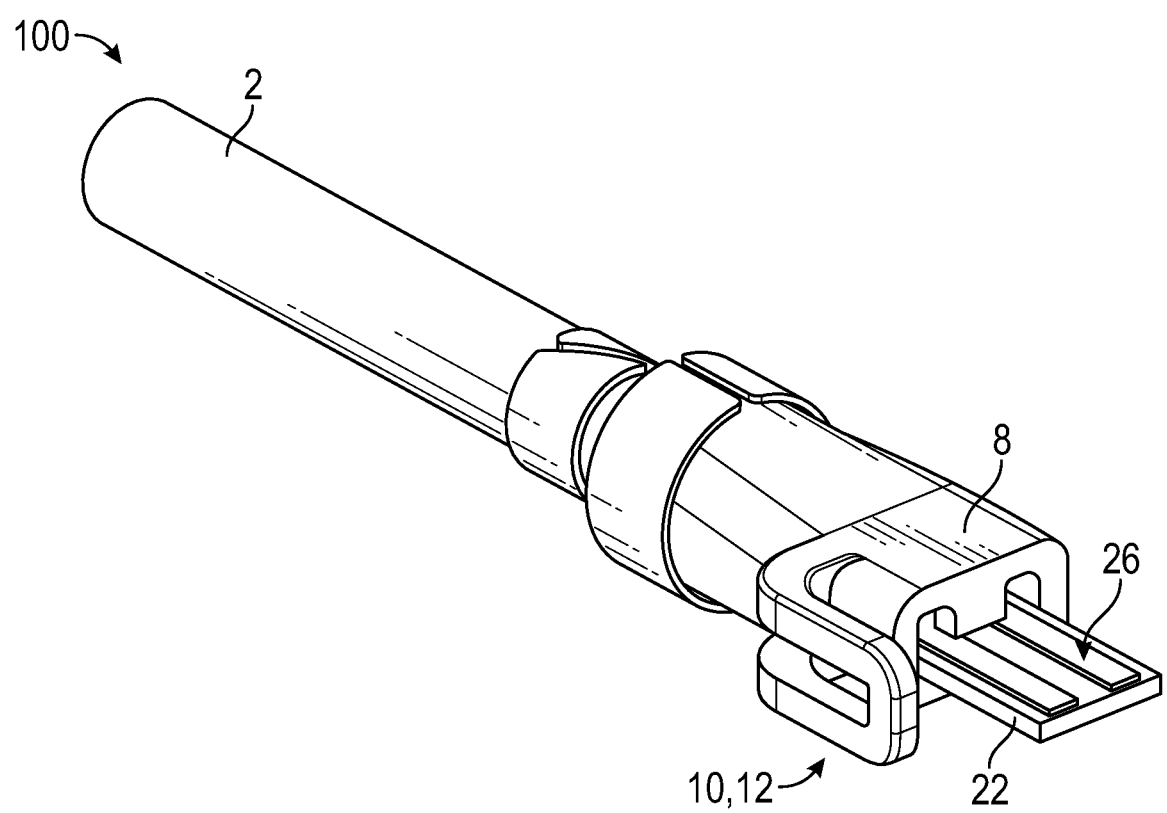
FIG. 3 is a perspective view of an electrical cable with a cable end housing affixed thereon, and a conductor plate protruding therefrom according to the present disclosure.

Finally, FIG. 3 depicts a first part of the cable arrangement 100 with the first cable 2, including the first cable end housing 8 and first conductor plate 22 in a perspective view. From this it is evident that the conductor plate 22 (as also the second conductor plate 23) in this exemplary form features two second contact sections 26 for two coupling elements 19, since the first cable 2 has the two electrical conductors 4, 5.

Proceeding from the illustrated exemplary example, the cable arrangement 100 and the connector 1 can be modified in many respects. For example, it is possible that shielding elements for electrical shielding are arranged in the cable end housings 8, 9 and/or in the coupling housing 14. It is also possible that the snap-in units 10, 11 and the opposing snap-in units 15, 16 can have a different structural design.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. An electrical connector for electrical connecting of at least two electrical conductors, each of the at least two electrical conductors having first and second electrical cables, the electrical connector comprising:

at least one first conductor plate and at least one second conductor plate, each of the conductor plates having:

first contact sections and second contact sections which correspond to a number of conductors for electrical contacting of the at least two electrical conductors; and a plurality of coupling elements corresponding to the number of conductors for electrical contacting, the plurality of coupling elements configured for electrical contacting of the second contact sections by bridging a spatial gap between the first and second conductor plate and the plurality of coupling elements arranged within a coupling housing which is attached to the first and second electrical cables, wherein the second contact sections of the at least one first and second conductor plates are inserted into the coupling housing and wherein a cable end housing is disposed at a cable end of each the first and second electrical cables, the cable end housing extending into the coupling housing, and the second contact sections being disposed within the cable end housings, at least a section of the respective at least one first and second conductor plates extends beyond the respective cable end housing and into the coupling housing.

2. The electrical connector according to claim 1, wherein the plurality of coupling elements rest in a detachable manner against the second contact sections.

3. The electrical connector according to claim 1, wherein the plurality of coupling elements are embedded in the coupling housing by over-molding with plastic.

4. The electrical connector according to claim 1, wherein the cable end housing includes an electrical shielding element.

5. The electrical connector according to claim 1, wherein the cable end housing includes a snap-in unit for connecting the first and second electrical cables by the coupling element.

6. An electrical cable arrangement comprising:
   at least two electrical cables, each electrical cable including at least two electrical conductors; and
   an electrical connector according to claim 1, wherein the electrical connector connects the at least two electrical cables.

7. The electrical cable arrangement according to claim 6, wherein a cable end housing with a snap-in unit facing away from a cable end of each electrical cable among the at least two electrical cables is arranged at the cable end of each electrical cable facing the electrical connector.

8. The cable arrangement according to claim 7, wherein the cable end housings are connected to each other by a coupling housing.

9. The electrical connector according to claim 1, wherein the coupling housing further comprises a middle web configured to hold the coupling elements in position.

* * * * *